(12) United States Patent
Jain et al.

(10) Patent No.: US 8,093,929 B2
(45) Date of Patent: Jan. 10, 2012

(54) PROGRAMMABLE DIGITAL CLOCK SIGNAL FREQUENCY DIVIDER MODULE AND MODULAR DIVIDER CIRCUIT

(75) Inventors: Ankesh Jain, Agra (IN); Deependra Jain, Jabaplur (IN); Krishna Thakur, Greater Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 204 days.

(21) Appl. No.: 12/715,396

(22) Filed: Mar. 2, 2010

(65) Prior Publication Data

US 2011/0215842 A1     Sep. 8, 2011

(51) Int. Cl.
*H03K 21/00*     (2006.01)
*H03K 23/00*     (2006.01)
*H03K 25/00*     (2006.01)

(52) U.S. Cl. ......... 327/115; 327/116; 327/117; 327/218

(58) Field of Classification Search ................... 327/115, 327/116, 117, 118, 355–361, 202, 203, 208–212, 327/218; 377/47, 48
See application file for complete search history.

(56) References Cited

U.S. PATENT DOCUMENTS

| | | | |
|---|---|---|---|
| 4,234,849 A | 11/1980 | Crilly, Jr. | |
| 4,390,960 A | 6/1983 | Yamashita et al. | |
| 4,696,020 A | 9/1987 | Carlach | |
| 4,951,303 A | 8/1990 | Larson | |
| 5,442,670 A | 8/1995 | Shu | |
| 6,351,756 B1* | 2/2002 | Taniyoshi | 708/103 |
| 6,696,870 B2* | 2/2004 | Dellow | 327/115 |
| 6,879,654 B2* | 4/2005 | Austin | 377/48 |
| 7,554,369 B2 | 6/2009 | Kirichenko | |
| 2002/0043933 A1* | 4/2002 | Ooishi et al. | 313/512 |
| 2002/0171459 A1* | 11/2002 | Dellow | 327/115 |
| 2003/0107415 A1* | 6/2003 | Nguyen | 327/115 |
| 2004/0213369 A1* | 10/2004 | Austin | 377/47 |

(Continued)

OTHER PUBLICATIONS

Yang Yu-che et al., A Dual Mode Truly Modular Programmable Fractional Divider Based on a 1/1.5 Divider Cell, IEEE Microwave and Wireless Components Letters, vol. 15, No. 11, Nov. 2005.

(Continued)

*Primary Examiner* — Lincoln Donovan
*Assistant Examiner* — Brandon s Cole
(74) *Attorney, Agent, or Firm* — Charles Bergere

(57) ABSTRACT

A programmable digital clock signal frequency divider module has a module clock input, module clock output, a scaling factor input, two programming inputs, and a tertiary input. A primary divider module with a primary divider module output and a clock input are coupled to the module clock input. A secondary divider module includes a multiplexer and a divide by two latch with a latch clock input coupled to the primary divider module output. In operation, logic values applied to the scaling factor input, and the programming inputs, result in the primary divider module processing a first sequence of cycles of a primary digital clock signal into a first base clock signal and processing a subsequent second sequence of cycles into a second base clock signal. The first base clock signal and the second base clock signal provide a sequence of clock pulses to the secondary divider module. Edges of the sequence of clock pulses trigger the divide by two latch, which results in a latch output clock signal with a 50% duty cycle at the output of the divide by two latch. Logic values at the tertiary input select either the sequence of clock pulses or the latch output clock signal to be a module clock output signal at the module clock output.

20 Claims, 6 Drawing Sheets

U.S. PATENT DOCUMENTS

| | | | |
|---|---|---|---|
| 2005/0146362 A1* | 7/2005 | Austin et al. | 327/115 |
| 2008/0042698 A1* | 2/2008 | Kim | 327/116 |
| 2008/0258781 A1 | 10/2008 | Song | |
| 2009/0167373 A1 | 7/2009 | Song | |
| 2009/0251176 A1 | 10/2009 | Miller | |
| 2010/0085085 A1* | 4/2010 | Yang | 327/117 |
| 2011/0215842 A1* | 9/2011 | Jain et al. | 327/115 |

OTHER PUBLICATIONS

C.S. Vaucher, I. Ferencic, M. Locher, S. Sedvallson, U. Voegeli, and Z. Wang, "A Family of Low-Power Truly Modular Programmable Dividers in Standard 0.35-um CMOS Technology," IEEE J. Solid-State Circuits, vol. 35, No. 7, pp. 1039-1045, May 2000.

* cited by examiner

PROGRAMMABLE DIGITAL CLOCK SIGNAL FREQUENCY DIVIDER MODULE AND MODULAR DIVIDER CIRCUIT

BACKGROUND OF THE INVENTION

The present invention relates to a programmable digital clock signal frequency divider module and a modular digital clock signal frequency divider circuit for dividing a system clock signal, and, more specifically, to a programmable digital clock signal frequency divider module suitable for use in a prescaler architecture and modular digital clock signal frequency divider circuits that have a prescaler architecture.

Many digital electronic circuits require one or more digital clock signals in order to function. There are numerous types of digital clock signals such as short constant frequency pulsed signals, irregular frequency pulsed signals, clock signals with uneven duty cycles and clock signals with a 50% duty cycle. For high speed circuits, such as dual data rate circuits, it is highly desirable to use digital clock signals with a 50% duty cycle. One option for creating different clock signals is by using a modular programmable digital clock signal frequency divider circuit having series connected modules (cells). The modular programmable digital clock signal frequency divider circuit has a prescaler architecture that can be programmed to convert an input digital clock signal into one of many lower frequency output digital clock signals. The prescaler architecture that does not have long delay loops as feedback is essentially only present within a module or between adjacent modules. However, such divider circuits may not be able to provide a 50% duty cycle for every one of the lower frequency output digital clock signals.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
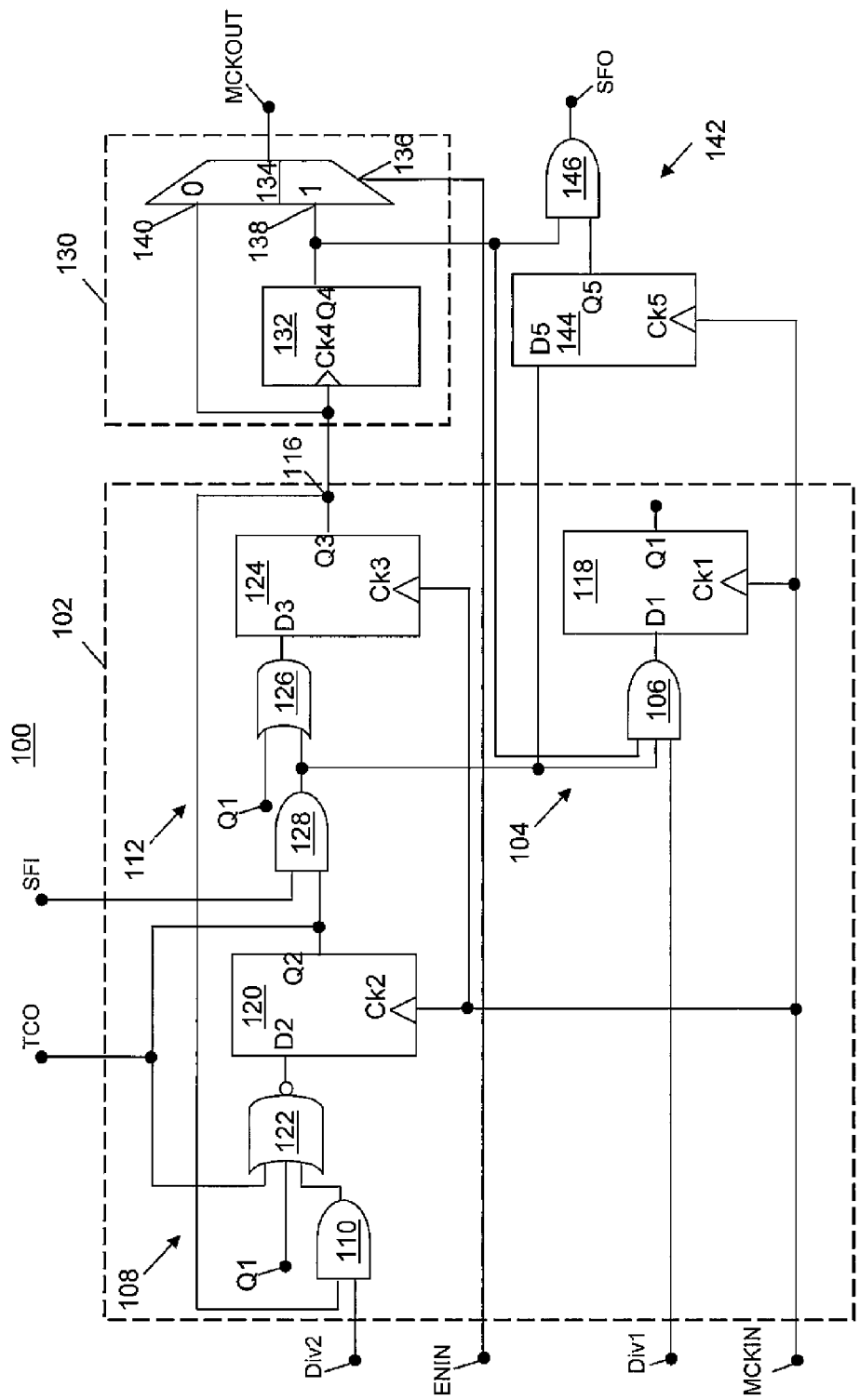
FIG. 1 is a schematic block diagram of a programmable digital clock frequency signal divider module in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," and variations thereof are intended to cover a non-exclusive inclusion, such that module, circuit, device components and method steps that comprise a list of elements or steps do not include only those elements but may include other elements or steps not expressly listed or inherent to such module, circuit, device components or steps. An element or step proceeded by "comprises . . . a" does not, without more constraints, preclude the existence of additional identical elements or steps that comprise the element or step.

In one embodiment, the present invention provides a programmable digital clock signal frequency divider module with a module clock input, module clock output, a scaling factor input, two programming inputs and one tertiary input. There is a primary divider module that includes a first primary module latch circuit with an input coupled to a first one of the programming inputs, a second primary module latch circuit with an input coupled to a second one of the programming inputs, and a third primary module latch circuit with an input coupled to the scaling factor input. An output of the third primary module latch circuit provides a primary divider module output and the module clock input is coupled to clock inputs of the first, second and third primary module latch circuits.

There is a secondary divider module that includes a multiplexer and a divide by two latch with a latch clock input coupled to the primary divider module output. The multiplexer has a multiplexer output, that provides the module clock output, a multiplexer control input coupled to the tertiary input, a first multiplexer data input coupled to an output of the divide by two latch and a second multiplexer data input coupled to the primary divider module output.

In operation logic values applied to the scaling factor input and the two primary divider module programming inputs control transfer of data between the first, second and third primary module latch circuits. This results in the primary divider module processing a first sequence of cycles of a primary digital clock signal with a primary digital clock signal period, supplied to the module clock input, into a first base clock signal with a first base clock signal period of at least twice the primary digital clock signal period. The logic values also result in the processing of a subsequent second sequence of cycles of the primary digital clock signal into a second base clock signal with a second base clock signal period of at least twice the primary digital clock signal period. The first base clock signal and the second base clock signal provide a sequence of clock pulses to the secondary divider module. Edges of the sequence of clock pulses trigger the divide by two latch thereby resulting in a latch output clock signal with a 50% duty cycle at the output of the divide by two latch. Logic values at the tertiary input select either the sequence of clock pulses or the latch output clock signal to be a module clock output signal at the module clock output.

In another embodiment, the present invention provides a modular digital clock signal frequency divider circuit for dividing a system clock signal, the modular digital clock signal frequency divider system comprising a plurality of series connected programmable digital clock signal frequency divider modules. One of the modules is an output stage module with a module clock input, module clock output, a scaling factor input, two programming inputs and a tertiary input. The output stage module includes a primary divider module that includes a first primary module latch circuit with an input coupled to a first one of the programming inputs, a second primary module latch circuit with an input coupled to a second one of the programming inputs, and a third primary module latch circuit with an input coupled to the scaling factor input. An output of the third primary module latch circuit provides a primary divider module output and the module clock input is coupled to clock inputs of the first, second and third primary module latch circuits.

There is a secondary divider module that includes a multiplexer and a divide by two latch with a latch clock input coupled to the primary divider module output. The multiplexer has a multiplexer output, that provides the module clock output, a multiplexer control input coupled to the tertiary input, a first multiplexer data input coupled to an output of the divide by two latch and a second multiplexer data input coupled to the primary divider module output.

In operation logic values applied to the scaling factor input and the two programming inputs control transfer of data between the first, second and third primary module latch circuits. This results in the primary divider module processing a first sequence of cycles of a primary digital clock signal with a primary digital clock signal period, supplied to the module clock input, into a first base clock signal with a first base clock signal period of at least twice the primary digital clock signal period. The logic values also result in the processing of a subsequent second sequence of cycles of the primary digital clock signal into a second base clock signal with a second base clock signal period of at least twice the primary digital clock signal period. The first base clock signal and the second base clock signal provide a sequence of clock pulses to the secondary divider module. Edges of the sequence of clock pulses trigger the divide by two latch thereby resulting in a latch output clock signal with a 50% duty cycle at the output of the divide by two latch. Logic values at the tertiary input select either the sequence of clock pulses or the latch output clock signal to be a module clock output signal at the module clock output.

Referring to FIG. 1 a schematic block diagram of a programmable digital clock frequency signal divider module 100 in accordance with an embodiment of the present invention is shown. The programmable digital clock frequency signal divider module 100 has a module clock input MCKIN, a module clock output MCKOUT, a scaling factor input SFI, programming inputs Div1 and Div2 and one tertiary input ENIN. There is a primary divider module 102 that includes a first primary module latch circuit 104 that has an AND gate 106 with a first input coupled to a first one of the programming inputs Div1. There is a second primary module latch circuit 108 that has an AND gate 110 with a first input coupled to a second one of the programming inputs Div2. There is also a third primary module latch circuit 112 that has an AND gate 114 with an input coupled to the scaling factor input SFI.

The first primary module latch circuit 104 includes a latch in the form of a D-type flip flop 118 with a clock input CK1, output Q1, and a data input D1 that is coupled to an output of the AND gate 106. Also, the second primary module latch circuit 104 includes a latch in the form of a D-type flip flop 120 with a clock input CK2, output Q2, and a data input D2 that is coupled to an output of a NOR gate 122. A first input of the NOR gate 122 is coupled to an output of the AND gate 110 and a second input of the NOR gate 122 is coupled to the output Q2 of the D-type flip flop 120. The third primary module latch circuit 112 includes a latch in the form of a D-type flip flop 124 with a clock input CK3, output Q3, and a data input D3 that is coupled to an output of an OR gate 126. A first input of the OR gate 126 is coupled to an output of an AND gate 128. Also, a first input of the AND gate 128 (which is an input of the third primary module latch circuit 112) is coupled to the output Q2 of the D-type flip flop 120, and a second input of the AND gate 128 (which is an input of the third primary module latch circuit 112) is coupled to the scaling factor input SFI.

In this embodiment, the modular clock input MCKIN is coupled to clock inputs (CK1, CK2 and CK3) of the first, second and third primary module latch circuits 104, 108 and 112. The output Q3 of the D-type flip flop 124 is the output of third primary module latch circuit 112 and provides a primary divider module output 116. Also, the output Q2 of the D-type flip flop 122 is the output of second primary module latch circuit 108 and the output Q1 of the D-type flip flop 118 is the output of first primary module latch circuit 104. As will be understood by a person skilled in the art, the output Q2 of the D-type flip flop 120 is selectively connectable through the AND gate 128 to a second input of the AND gate 106 that provides an input of the first primary module latch circuit 104. The output Q1 of the first primary module latch circuit 104 is coupled to both an input of the second primary module latch circuit 108 (at a third input of the NOR gate 122) and at an input of the third primary module latch circuit 112 (at a second input of the OR gate 126). Furthermore, the output of the third primary module latch circuit Q3 is coupled to an input (at second input of the AND gate 110) of the second primary module latch circuit 108.

The programmable digital clock frequency signal divider module 100 has a secondary divider module 130 that includes a divide by two latch, in the form of a T-type flip flop 132, with a latch clock input CK4 coupled to the primary divider module output 116. There is a multiplexer 134 with a multiplexer output, providing the module clock output MCKOUT, and there is a multiplexer control input 136 coupled to the tertiary input ENIN. The multiplexer 134 also has a first multiplexer data input 138 coupled to an output Q4 of the T-type flip-flop 134 (divide by two latch) and a second multiplexer data input 140 coupled to the primary divider module output 116. The output Q4 of the T-type flip-flop 134 is also coupled to a third input of the AND gate 106.

The programmable digital clock frequency signal divider module 100 has a scaling factor output SFO and there is a tertiary clock output TCO that is coupled to the output Q2 of the flip flop 120. There is also fourth primary module latch circuit 142 that has a latch in the form of a D-type flip flop 144 with a clock input CK5 coupled to the modular clock input MCKIN, a data input D5 that is coupled to an output of the AND gate 128, and an output Q5. There is an AND gate 146 with an output providing the scaling factor output SFO. The AND gate 146 has a first input coupled to the output Q5 and a second input coupled to the output Q4 of flip flop 132.

Figure 2:
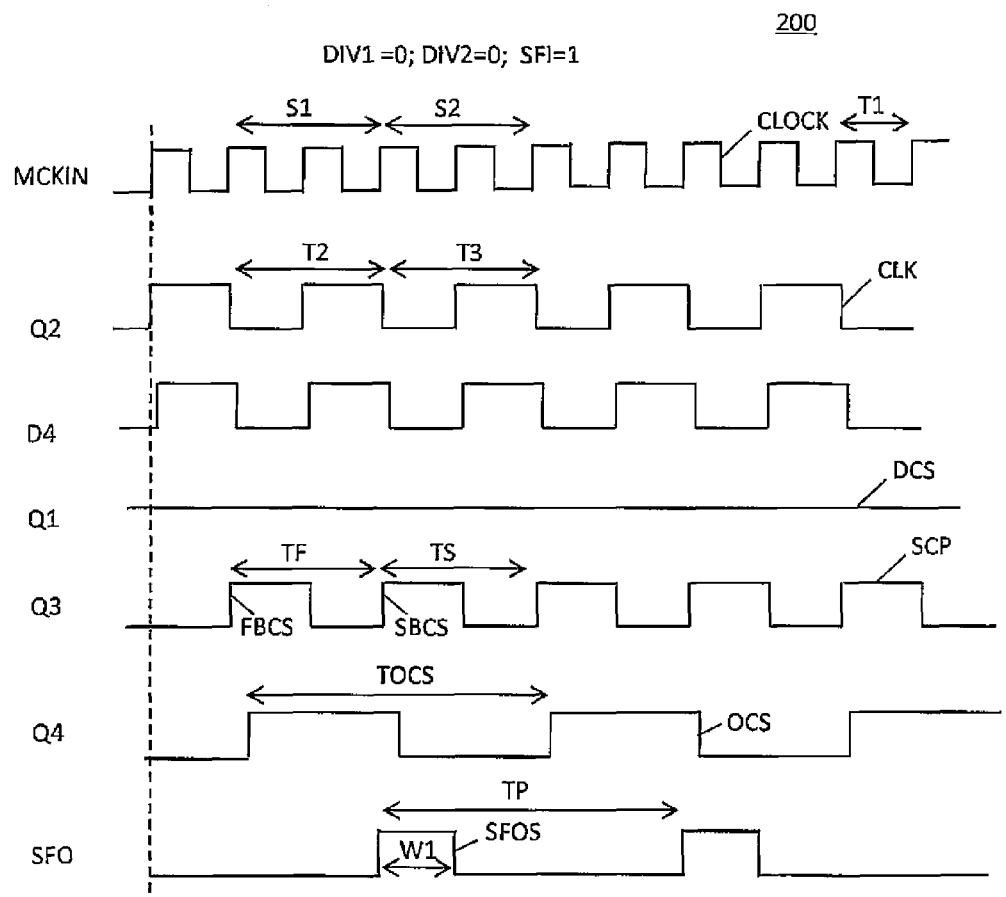
FIG. 2 is a timing diagram illustrating a primary digital clock signal and resulting signals at selected nodes in the programmable digital clock signal frequency divider module of FIG. 1.

Referring to FIG. 2 there is a waveform diagram 200 illustrating a primary digital clock signal CLOCK at the module clock input MCKIN and resulting signals, at selected nodes in the programmable digital clock signal frequency divider module 100, when the programming inputs Div1 and Div2 are at logic 0 and a scaling factor input signal SFIS at the scaling factor input SFI is set to logic 1. The primary digital clock signal CLOCK has a primary digital clock signal period T1 and in this embodiment all flip flops (latches) 118, 120, 124, 132 and 144 are positive edge triggered. It will be apparent that since the programming input Div1 is at logic 0, the output of the AND gate 106 will always be at logic 0. Consequently, a divider control signal DCS at the output Q1 of the flip flop 118 will always be at logic 0 as will the second input of the NOR gate 122 and the second input of the OR gate 126. Also, since the programming input Div2 is at logic 0 the output of AND gate 110 will always be at logic 0, therefore the first input of the NOR gate 122 is always at logic 0. In this waveform diagram 200 the primary digital clock signal CLOCK is considered as comprising a first sequence of cycles S1 and a second first sequence of cycles S2. However, in this waveform diagram 200, the first sequence of cycles S1 and the second sequence of cycles S2 are identical.

As the first input and second input of the NOR gate 122 are always at logic 0, the output of the NOR gate 122 can only change in response to logic values at its third input. The NOR gate 122 therefore acts an inverter, by inverting logic values at its third input, so that the primary module latch circuit 108 operates as a divide by two circuit for both the first sequence of cycles S1 and second sequence of cycles S2. During the first sequence of cycles S1 a clocking signal CLK at the output Q2 (and tertiary clock output TCO) has a period T2 that is twice that of the primary digital clock signal period T1. Similarly, during the second sequence of cycles S2 the clocking signal CLK at the output Q2 (and tertiary clock output TCO) has a period T3 that is twice that of the primary digital clock signal period T1. Because the scaling factor input signal SFIS is set to logic 1, the AND gate 128 allows the clocking signal CLK to be applied the first input of the OR gate 126 and to the data input D5 of the D-type flip flop 144. Also, since the second input of the OR gate 126 is at logic 0 the clocking signal CLK is applied to the data input D3 of the D-type flip flop 124.

On rising edges of the primary digital clock signal CLOCK, clock pulses forming a sequence of clock pulses SCP are provided at the output Q3 of the D-type flip flop 12. More specifically, the primary divider module 102 processes the first sequence of cycles S1 of the primary digital clock signal CLOCK into a first base clock signal FBCS with a first base clock signal period TF that is twice the primary digital clock signal period T1. Also, the primary divider module 102 processes the second sequence of cycles S2 of the primary digital clock signal CLOCK into a second base clock signal SBCS with a second base clock signal period TS that is twice the primary digital clock signal period T1. For instance, when the tertiary input ENIN=1, a latch clock output signal OCS (at output Q4) is the module clock output signal CLKOUT supplied to the module clock output MCKOUT. Conversely, when the tertiary input ENIN=0, the sequence of clock pulses SCP is the module clock output signal CLKOUT supplied to the module clock output MCKOUT.

The combined first base clock signal FBCS and the second base clock signal SBCS provide the sequence of clock pulses SCP to the secondary divider module 130. Rising edges of the sequence of clock pulses trigger the divide by two latch (T-type flip flop 134) thereby resulting in a latch output clock signal OCS, with a 50% duty cycle at the output Q4 of the divide by two latch (T-type flip flop 134). Also, as illustrated, the output clock signal OCS has a period TOCS that is four times the primary digital clock signal period T1. Depending on the logic value of the tertiary input ENIN, a module clock output signal CLKOUT at the module clock output MCKOUT will either be the latch output clock signal OCS or the sequence of clock pulses SCP.

The scaling factor output SFO provides a scaling factor output signal SFOS that is essentially an AND function of the latch output clock signal OCS and the clocking signal CLK. As shown, the scaling factor output signal SFOS is a pulsed signal comprising identical spaced pulses of a pulse width W1 equal to the primary digital clock signal period T1. A time period TP of the scaling factor output signal SFOS is dependent on the logic values of the programming inputs Div1 and Div2. Moreover, as the period TOCS of the latch output clock signal OCS increases so does the time period TP of the scaling factor output signal SFOS.

From the above it will be apparent that logic values applied to the scaling factor input (in the form of the SFI provide the scaling factor input signal SFIS) either blocks or allows transfer of data from the output Q2 of the second primary module latch circuit 108 to the third primary module latch circuit. Also, it will be understood that the two programming inputs Div1, Div2 control transfer of data between the first, second and third primary module latch circuits 104, 108 and 112.

Figure 3:
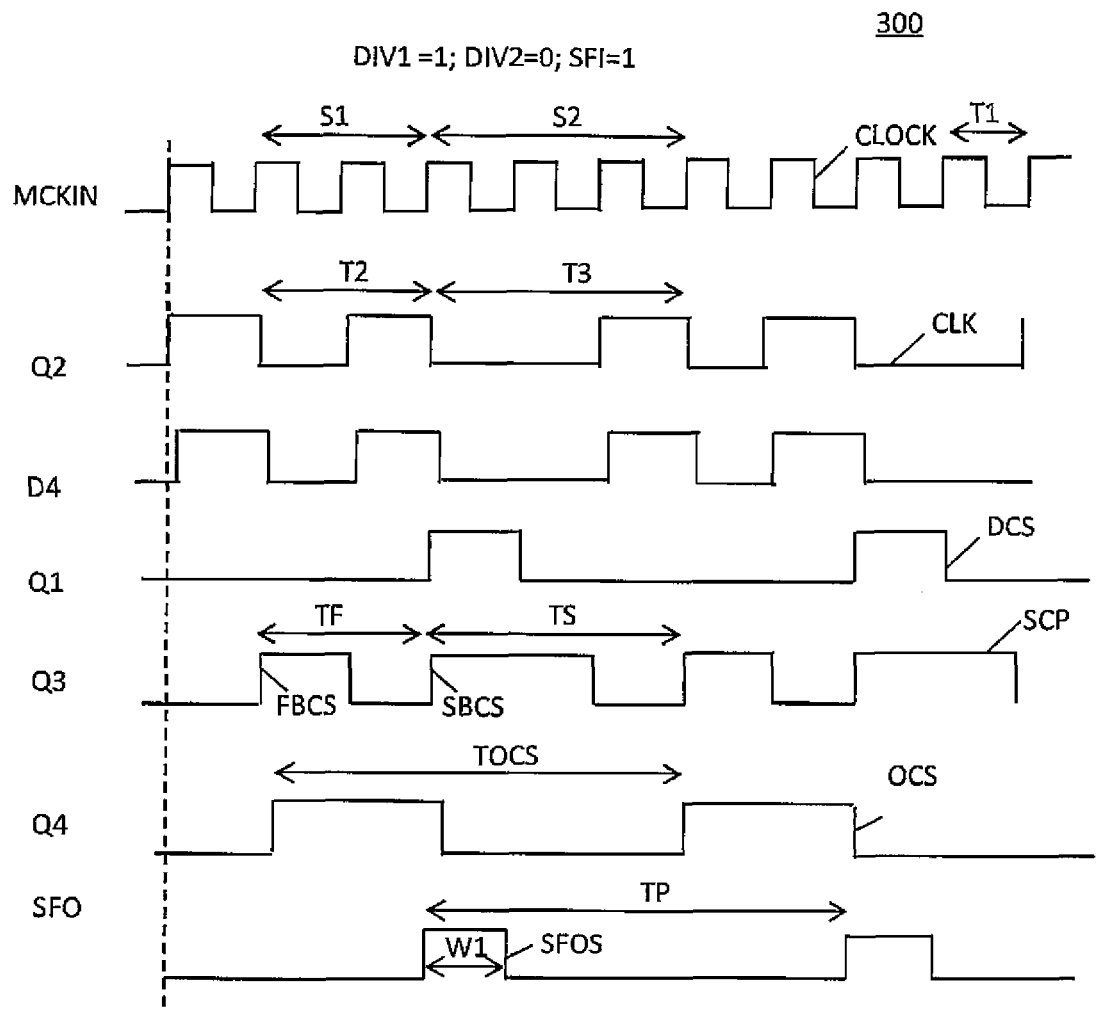
FIG. 3 is a timing diagram illustrating a primary digital clock signal and more resulting signals at selected nodes in the programmable digital clock signal frequency divider module of FIG. 1.

Referring to FIG. 3 there is a waveform diagram 300 illustrating the primary digital clock signal CLOCK at the module clock input MCKIN and resulting signals, at selected nodes in the programmable digital clock signal frequency divider module 100, when the programming input Div1 is at logic 1, the programming input Div2 is at logic 0 and the scaling factor input SFI is set to logic 1. Since the programming input Div1 is at logic 1, the output of the AND gate 106 will depend on logic values applied to its second and third inputs. Also, since the programming input Div2 is at logic 0 the output of AND gate 110 will always be at logic 0, therefore the first input of the NOR gate 122 is always at logic 0. Consequently, the output of the NOR gate 122 can only change in response to logic values at its second and third inputs.

Initially, the divider control signal DCS at the output Q1 of the D-type flip flop 118 is at logic 0 and therefore the third input of the NOR gate 122 is at logic 0 as is the second input of the OR gate 126. The NOR gate 122 therefore initially acts an inverter, by inverting logic values at its third input, so that the primary module latch circuit 108 operates as a divide by two circuit for the first sequence of cycles S1. During the first sequence of cycles S1 the clocking signal CLK at the output Q2 (and tertiary clock output TCO) has a period T2 that is twice that of the primary digital clock signal period T1. Because the scaling factor input SFI is set to logic 1, the AND 128 gate allows the clocking signal CLK to be applied the first input of the OR gate 126 and to the data input D4. Also, during the first sequence of cycles S1 the second input of the OR gate 126 is at logic 0, therefore the clocking signal CLK is applied to the data input D3.

On rising edges of the primary digital clock signal CLOCK, clock pulses forming the sequence of clock pulses SCP are selectively provided at the output Q3. More specifically, at the start of the second sequence of cycles S2 the divider control signal DCS at the output Q1 becomes a logic 1 for one primary digital clock signal period T1. Hence, the input D2 will be maintained at logic 0 and input D3 will maintained at logic 1 until output Q1 returns to logic 0. The output Q2 is therefore held at logic 0 and output Q3 is held at logic 1 for one extra cycle clock signal period T1. As a result, during the second sequence of cycles S2 the clocking signal CLK at the output Q2 (and tertiary clock output TCO) has a period T3 that is three times that of the primary digital clock signal period T1. It can therefore be seen that the primary divider module 102 processes the first sequence of cycles S1 of the primary digital clock signal CLOCK into the first base clock signal FBCS with a first base clock signal period TF that is twice the primary digital clock signal period T1. Also, the primary divider module 102 processes the second sequence of cycles S2 of the primary digital clock signal CLOCK into the second base clock signal SBCS with a second base clock signal period TS that is three times the primary digital clock signal period T1.

Depending on the logic value of the tertiary input ENIN, the module clock output signal CLKOUT at the module clock output MCKOUT will either be the latch output clock signal OCS with a 50% duty cycle or the sequence of clock pulses SCP. Also, as illustrated, the output clock signal OCS has a period TOCS that is five times the primary digital clock signal period T1.

Figure 4:
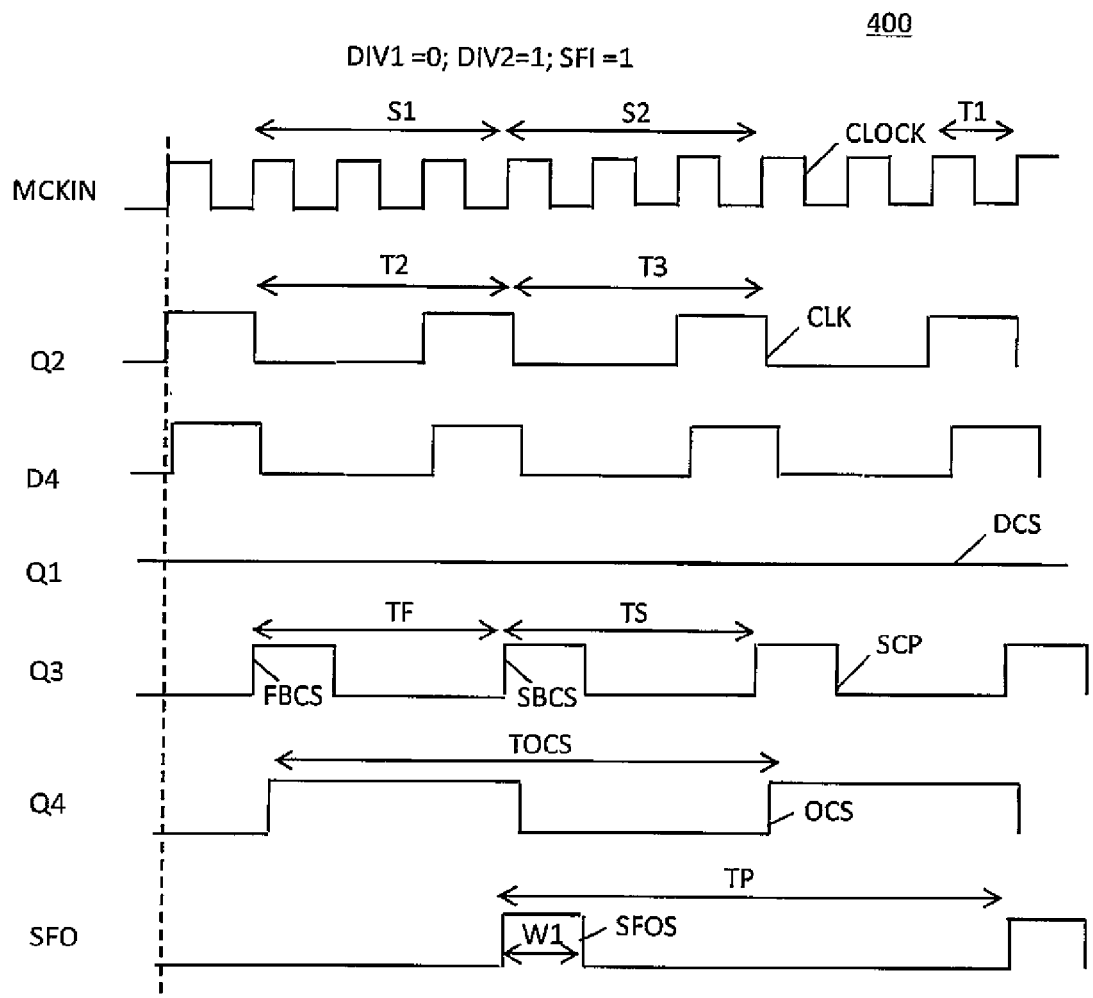
FIG. 4 is a timing diagram illustrating a primary digital clock signal and further resulting signals at selected nodes in the programmable digital clock signal frequency divider module of FIG. 1.

Referring to FIG. 4 there is a waveform diagram 400 illustrating the primary digital clock signal CLOCK at the module clock input MCKIN, and resulting signals at selected nodes in the programmable digital clock signal frequency divider module 100, when the programming input Div1 is at logic 0, the programming input Div2 is at logic 1 and the scaling factor input SFI is set to logic 1. Upon similar analysis as described above it can be seen that the primary divider module 102 processes the first sequence of cycles S1 of the primary digital clock signal CLOCK into the first base clock signal FBCS with a first base clock signal period TF that is three times the primary digital clock signal period T1. Also, the primary divider module 102 processes the second sequence of cycles S2 of the primary digital clock signal CLOCK into the second base clock signal SBCS with a second base clock signal period TS that is three times the primary digital clock signal period T1.

As above, depending on the logic value of the tertiary input ENIN, the module clock output signal CLKOUT at the module clock output MCKOUT will either be the latch output clock signal OCS with a 50% duty cycle or the sequence of clock pulses SCP. Also, as illustrated, the latch output clock signal OCS has a period TOCS that is six times the primary digital clock signal period T1.

Figure 5:
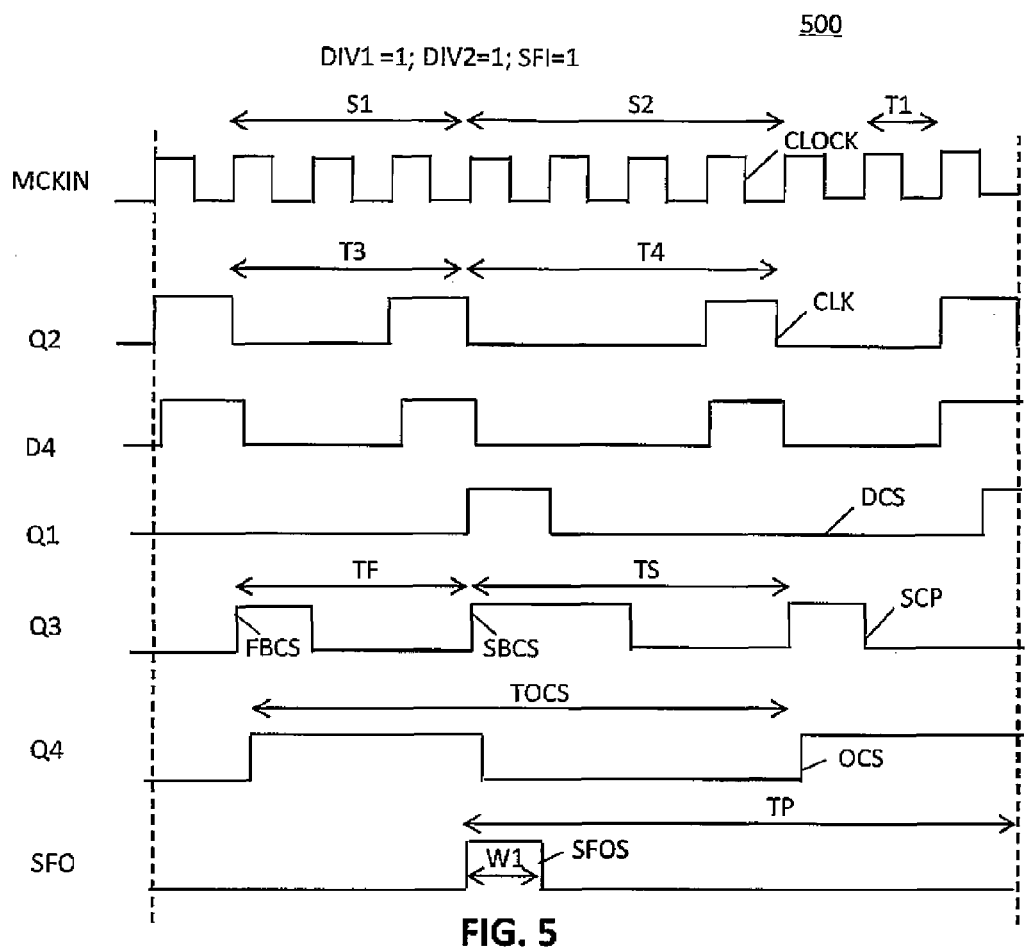
FIG. 5 is a timing diagram illustrating a primary digital clock signal and yet further resulting signals at selected nodes in the programmable digital clock signal frequency divider module of FIG. 1.

Referring to FIG. 5 there is a waveform diagram 500 illustrating the primary digital clock signal CLOCK at the module clock input MCKIN, and resulting signals at selected nodes in the programmable digital clock signal frequency divider module 100, when the programming inputs Div1 and Div2 are at logic 1 and the scaling factor input SFI is set to logic 1. Again, upon similar analysis as described above it can be seen that the primary divider module 102 processes the first sequence of cycles S1 of the primary digital clock signal CLOCK into the first base clock signal FBCS with a first base clock signal period TF that is three times the primary digital clock signal period T1. Also, the primary divider module 102 processes the second sequence of cycles S2 of the primary digital clock signal CLOCK into the second base clock signal SBCS with a second base clock signal period TS that is four times the primary digital clock signal period T1.

As above, depending on the logic value of the tertiary input ENIN, the module clock output signal CLKOUT at the module clock output MCKOUT will either be the latch output clock signal OCS with a 50% duty cycle or the sequence of clock pulses SCP. Also, as illustrated, the output clock signal OCS has a period TOCS that is seven times the primary digital clock signal period T1.

From the above it can be understood that, in operation, the first and second primary module latch circuits 104, 108 are programmable by the two inputs Div1, Div2 to process the first sequence of cycles S1 and second sequence of cycles S2 into the first base clock signal FBCS and the second base clock signal SBCS. The third primary module latch circuit 112 is programmable by the two programming inputs Div1, Div2 to delay the sequence of clock pulses SCP at the latch clock input Ck4 of the secondary divider module by one or more cycles of the primary digital clock signal CLOCK.

The above waveforms diagrams, 200, 300, 400, 500 and the function of the programmable digital clock signal frequency divider module 100 is summarized in table 1 below. It can be seen that when the programming inputs Div1 and Div2=0 and the tertiary input ENIN=0 then: the first base clock signal period TF is twice the primary digital clock signal period T1; the second base clock signal period TF is twice the primary digital clock signal period T1; and a module clock output period TOUT of the module clock output signal CLKOUT is also twice the primary digital clock signal period T1.

In another example, when the programming inputs Div1 and Div2=0 and the tertiary input ENIN=1 then: the first base clock signal period TF is twice the primary digital clock signal period T1; the second base clock signal period TF is twice the primary digital clock signal period T1; and the clock output period TOUT is four times the primary digital clock signal period T1. Hence, since the latch output clock signal OCS is also the module clock output signal CLKOUT then the period TOCS, of the latch output clock signal OCS, is twice the period of the first base clock signal period TF and twice the second base clock signal period TS.

In yet another example, when the programming inputs Div1=0, Div2=1 and the tertiary input ENIN=1 then: the first base clock signal period TF is twice the primary digital clock signal period T1; the second base clock signal period TF is three times the primary digital clock signal period T1; and the clock output period TOUT is five times the primary digital clock signal period T1.

In a further example, when the programming inputs Div1=0 and Div2=1 and the tertiary input ENIN=1 then: the first base clock signal period TF is three times the primary digital clock signal period T1; the second base clock signal period TF is also three times the primary digital clock signal period T1; and the clock output period TOUT is six times the primary digital clock signal period T1.

In one further example, when the programming inputs Div1=0 and Div2=0 and the tertiary input ENIN=1 then: the first base clock signal period TF is three times the primary digital clock signal period T1; the second base clock signal period TF is four times the primary digital clock signal period T1; and the clock output period TOUT is seven times the primary digital clock signal period T1.

TABLE 1

| ENIN | Div2 | Div1 | TF | TS | TOUT |
|------|------|------|----|----|------|
| 0 | 0 | 0 | 2 | 2 | 2 |
| 0 | 0 | 1 | 2 | 3 | 2 then 3 |
| 0 | 1 | 0 | 3 | 3 | 3 |
| 0 | 1 | 1 | 3 | 4 | 3 then 4 |
| 1 | 0 | 0 | 2 | 2 | 4 |
| 1 | 0 | 1 | 2 | 3 | 5 |
| 1 | 1 | 0 | 3 | 3 | 6 |
| 1 | 1 | 1 | 3 | 4 | 7 |

Table 1 is a simplified logic table for the programmable digital clock signal frequency divider module. Table 1 illustrates (only) when the scaling factor signal SFS permanently allows the uninterrupted transfer of data from the second primary module latch circuit 108 to the third primary module latch circuit 112. When the scaling factor input signal SFIS permanently allows this transfer of data, the logic values applied to the programming inputs Div1, Div2 and tertiary input ENIN determine the output signal period of an output signal CLKOUT at the module clock output MCKOUT. Also, when this transfer of data is permanently allowed, the output signal period is selected from the group of: twice the primary digital clock signal period T1; three times the primary digital clock signal period T1; four times the primary digital clock signal period; five times the primary digital clock signal period T1; six times the primary digital clock signal period T1; and seven times the primary digital clock signal period T1.

Figure 6:
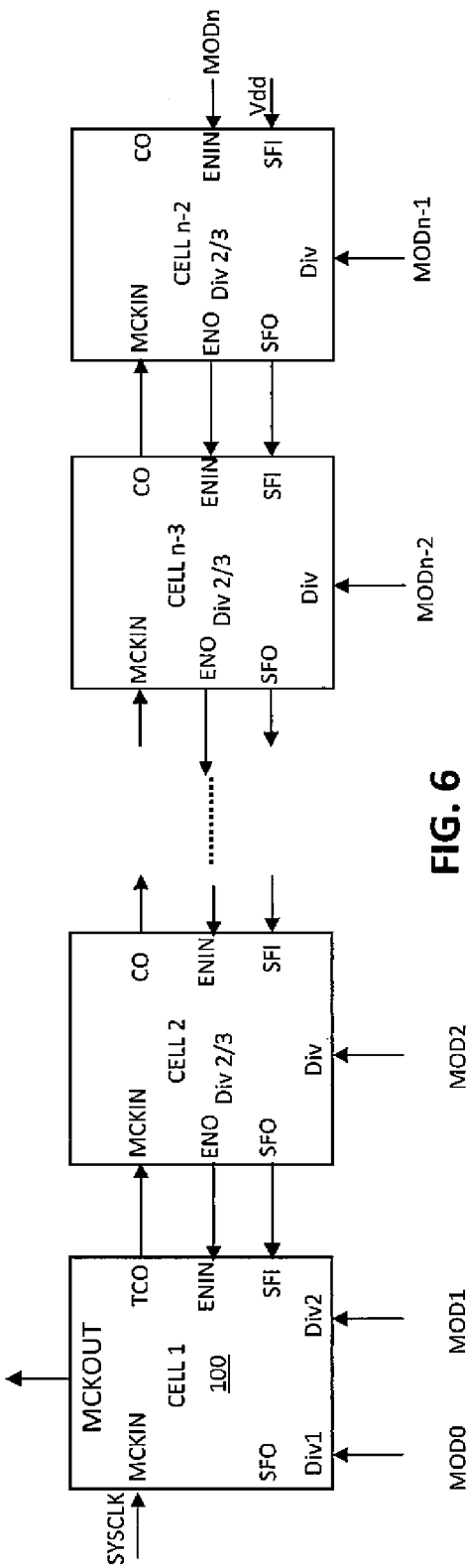
FIG. 6 is a schematic block diagram of a modular digital clock signal frequency divider circuit in accordance with an embodiment of the present invention.

Referring now to FIG. 6 there is illustrated a schematic circuit diagram of a modular digital clock signal frequency divider circuit 600 in accordance with one embodiment of the present invention. The modular digital clock signal frequency divider circuit 600 is used to for dividing a system clock signal SYSCLK. The modular digital clock signal frequency divider circuit 600 includes a plurality of series connected programmable digital clock signal frequency divider modules (cells) from cell 1 to cell n−2. An output stage module (cell 1) is the digital clock signal frequency divider 100. All other modules (cell cells 2 to n−2) are programmable divide by 2 or 3 modules as described in Cicero et al., IEEE Journal Of Solid-State Circuits, Vol. 35, No. 7, pp 1039-1045, July 2007 which is incorporated fully into this specification by reference.

Each of the modules of cell 1 to cell n−1 has respective programming inputs MOD0 to MODn. The programmable divide by 2 or 3 modules divide by 2 when their respective programming input is set to 0 and divide by 3 when their respective programming input is set to 1. The digital clock signal frequency divider 100 of cell 1 operates as described above and, with the exception of the module clock output MCKOUT and Tertiary outputs ENO of the divide by 2 or 3 modules, all of the modules cells 2 to n−1 have similar functioning inputs and outputs to cell 1. Module 1 (cell 1) receives the system clock signal SYSCLK and its tertiary clock output TCO is coupled to the module clock input MCKIN of cell 2. A scaling factor output SFO of cell 2 is coupled to a scaling factor input SFI of cell 1. Also, the clock output CO of cell 2 is coupled to the module clock input MCKIN of a higher order adjacent cell (cell 3), the tertiary input ENIN of cell 2 is coupled to tertiary output ENO of cell 3 and the scaling factor input SFI of cell 2 is coupled to the scaling factor output SFO of cell 3. Where appropriate, all other cells are connected in the same way.

The modular digital clock signal frequency divider circuit 600 is a prescaler architecture with the scaling factor input SFI of cell n−2 being tied to Vdd (logic 1) and therefore a scaling factor signal SFS propagates from cell n−2 and is modified by each cell (depending on the value of the programming inputs MODn−1 to MOD3) until it reaches the Scaling factor input SFI of cell 1. The scaling factor signal SFS, combined with the logic values the programming inputs of MOD0 to MODn, then determine a clock output signal period TOUT of the module clock output signal CLKOUT at the module clock output MCKOUT. More specifically, the clock output period TOUT=

$$(2^{n-1} \times MODn-1 + 2^{n-2} \times MODn-2 + \ldots 2 \times MOD1 + MOD0) \times Tin \quad (1)$$

where Tin is a period of the system clock signal SYSCLK, n−2 is the number of modules in the circuit 600, MOD0 to MODn are binary values that are selectively applied to a programming input or inputs of a respective module (cell) of the circuit 600.

From equation 1 it can be determined that, for instance, when the modular digital clock signal frequency divider circuit 600 comprises four cells, the clock output period TOUT can be programmed to be in an integer range of 2 to 31 times that of Tin. It will be apparent to a person skilled in the art that not all possible permutations of the operation of the programmable digital clock frequency signal divider module 100 are utilized. This is because in practice the programmable digital clock frequency signal divider module 100 would typically operate as a programmable divide by 2, 3 or 4 module when forming part of a modular digital clock signal frequency divider circuit. However, if desired the programmable digital clock frequency signal divider module 100 could operate as a divide by 2, 3, 4, 5, 6 and 7 by suitable values applied to MOD1, MOD2 and the tertiary input ENIN of cell 1.

Figure 7:
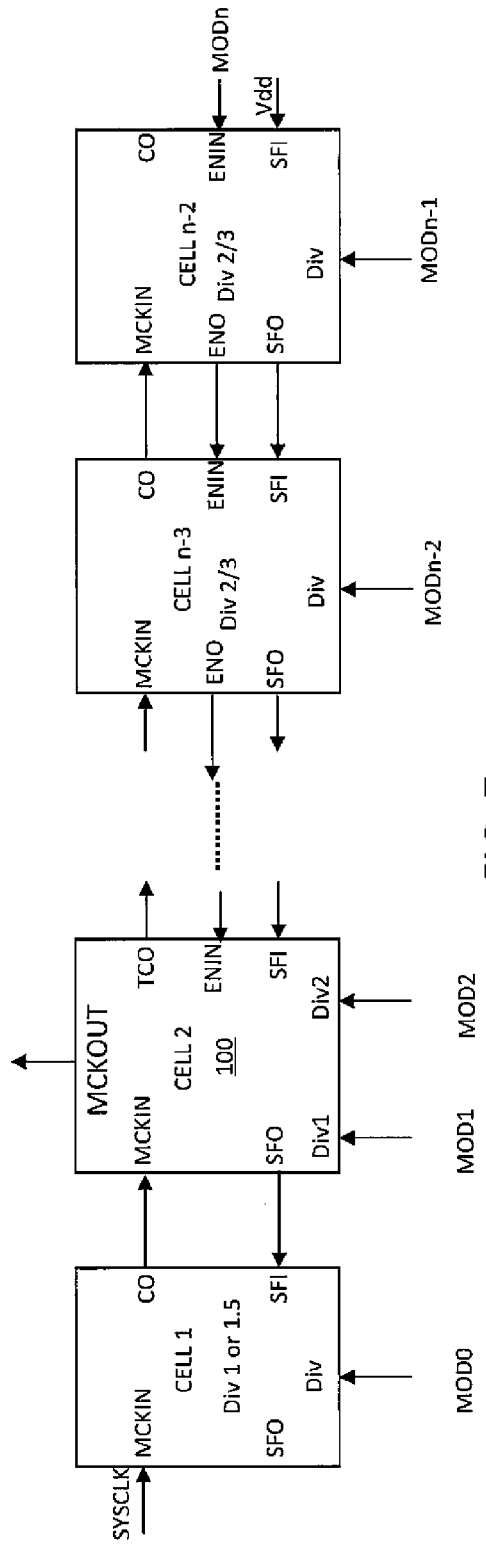
FIG. 7 is a schematic block diagram of a modular digital clock signal frequency divider circuit in accordance with another embodiment of the present invention.

Referring to FIG. 7 there is illustrated a schematic circuit diagram of a modular digital clock signal frequency divider circuit 700 in accordance with one embodiment of the present invention. The modular digital clock signal frequency divider circuit 700 is almost identical to modular digital clock signal frequency divider circuit 600 with the exception that cell 1 is now a divide by 1 or 1.5 cell and cell 2 is now the divide by the programmable digital clock frequency signal divider module 100. The divide by 1 or 1.5 cell is described in Yang et al., IEEE Microwave and Wireless Components Letters, Vol. 15, No. 11, pp 754-756, November 2005 which is incorporated fully into this specification by reference. The scaling factor signal SFS, combined with the logic values the programming inputs of MOD1, then determine the clock output signal period TOUT. This clock output period TOUT=

$$(2^{n-1} \times MODn-1 + 2^{n-2} \times MODn-2 + \ldots MOD1 + 0.5 \times MOD0) \times Tin \quad (2)$$

Where Tin is a period of the system clock signal SYSCLK, n−2 is the number of modules in the circuit 700, MOD0 to MODn are binary values that are selectively applied to a programming input or inputs of a respective module (cell) of the circuit 700.

From equation 2 it can be determined that, for instance, when the modular digital clock signal frequency divider circuit 600 comprises five cells, the clock output period TOUT can be programmed to be in an integer range of 2 to 31.5 times that of Tin. Again, it will be apparent to a person skilled in the art that not all possible permutations of the operation of the programmable digital clock frequency signal divider module 100 are utilized. This is because in practice the programmable digital clock frequency signal divider module 100 would typically operate as a programmable divide by 2, 3 or 4 module when forming part of a modular digital clock signal frequency divider circuit. However, if desired the programmable digital clock frequency signal divider module 100 could operate as a divide by 2, 3, 4, 5, 6 and 7 by suitable values applied to MOD1, MOD2 and the tertiary input ENIN of cell 2.

Advantageously, the present invention provides a programmable digital clock signal frequency divider module suitable for use in a prescaler architecture and modular digital clock signal frequency divider circuit with a prescaler architecture. The present invention alleviates the need for long delay loops as feedback is essentially only present within a module or between adjacent modules or cells. Also, the module clock output signal CLKOUT has a 50% duty cycle and is therefore suitable for providing clock signals to high speed circuits such as dual data rate circuits.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A programmable digital clock signal frequency divider module with a module clock input, module clock output, a scaling factor input, two programming inputs and a tertiary input, the programmable digital clock signal frequency divider comprising:

a primary divider module that includes a first primary module latch circuit with an input coupled to a first one of the programming inputs, a second primary module latch circuit with an input coupled to a second one of the programming inputs, and a third primary module latch circuit with an input coupled to the scaling factor input, wherein an output of the third primary module latch circuit provides a primary divider module output, and wherein the module clock input is coupled to clock inputs of the first, second and third primary module latch circuits; and a secondary divider module that includes a multiplexer and a divide by two latch, wherein the divide by two latch has a latch clock input coupled to the primary divider module output, and wherein the multiplexer that has a multiplexer output that provides the module clock output, a multiplexer control input coupled to the tertiary input, a first multiplexer data input coupled to an output of the divide by two latch and a second multiplexer data input coupled to the primary divider module output, wherein in operation the scaling factor input and the two programming inputs control a transfer of data between the first, second and third primary module latch circuits resulting in the primary divider module processing a first sequence of cycles of a primary digital clock signal with a primary digital clock signal period, supplied to the module clock input, into a first base clock signal with a first base clock signal period of at least twice the primary digital clock signal period and processing a subsequent second sequence of cycles of the primary digital clock signal into a second base clock signal with a second base clock signal period of at least twice the primary digital clock signal period, and wherein the first and second base clock signals provide a sequence of clock pulses to the secondary divider module, and edges of the sequence of clock pulses trigger the divide by two latch resulting in a latch output clock signal with a 50% duty cycle at the output of the divide by two latch, and wherein the tertiary input selects one of the sequence of clock pulses and the latch output clock signal to be a module clock output signal at the module clock output.

2. The programmable digital clock signal frequency divider module of claim 1, wherein an output of the second primary module latch circuit is coupled to an input of the third primary module latch circuit and selectively connectable to an input of the first primary module latch circuit, and an output of the first primary module latch circuit is coupled to both an input of the second primary module latch circuit and an input of the third primary module latch circuit, and wherein the output of the third primary module latch circuit is coupled to an input of the second primary module latch circuit.

3. The programmable digital clock signal frequency divider module of claim 1, wherein the latch output clock signal has a clock period that is twice a period of the first base clock signal.

4. The programmable digital clock signal frequency divider module of claim 3, wherein the first base clock signal period is twice the primary digital clock signal period and the second base clock period is twice the primary digital clock signal period.

5. The programmable digital clock signal frequency divider module of claim 3, wherein the first base clock signal period is twice the primary digital clock signal period and the second base clock period is three times the primary digital clock signal period.

6. The programmable digital clock signal frequency divider module of claim 3, wherein the first base clock signal period is three times the primary digital clock signal period and the second base clock period is three times the primary digital clock signal period.

7. The programmable digital clock signal frequency divider module of claim 3, wherein the first base clock signal period is three times the primary digital clock signal period and the second base clock period is four times the primary digital clock signal period.

8. The programmable digital clock signal frequency divider module of claim 7, wherein in operation the first and second primary module latch circuits are programmable by the two programming inputs to process the first and second sequences of cycles into the first base clock signal and the second base clock signal, and the third primary module latch circuit is programmable by the two programming inputs to delay the sequence of clock pulses at the latch clock input of the secondary divider module by at least one cycle of the primary digital clock signal.

9. The programmable digital clock signal frequency divider module of claim 8, wherein in operation the scaling factor input provides a scaling factor input signal that blocks transfer of data from the second primary module latch circuit to the third primary module latch circuit.

10. The programmable digital clock signal frequency divider module of claim 9, wherein in operation when the scaling factor signal allows the transfer of data from the second primary module latch circuit to the third primary module latch circuit, logic values applied to the two programming inputs and the tertiary input determine an output signal period of the module clock output signal.

11. The programmable digital clock signal frequency divider module of claim 10, wherein when the scaling factor signal allows the transfer of data from the output of the second primary module to the primary divider module output, the output signal period is selected from the group of: twice the primary digital clock signal period; three times the primary digital clock signal period; four times the primary digital clock signal period; five times the primary digital clock signal period; six times the primary digital clock signal period; and seven times the primary digital clock signal period.

12. The programmable digital clock signal frequency divider module of claim 1, further including a scaling factor output that provides a pulsed signal comprising identical spaced pulses of a pulse width equal to the primary digital clock signal period.

13. The programmable digital clock signal frequency divider module of claim 1, further including a tertiary clock output that provides a clocking signal CLK, wherein during the first sequence of cycles the clocking signal CLK has a period that is at least twice that of the primary digital clock signal period.

14. A modular digital clock signal frequency divider circuit for dividing a system clock signal, the modular digital clock signal frequency divider circuit comprising a plurality of series connected programmable digital clock signal frequency divider modules, wherein one of the modules is an output stage module with a module clock input, module clock output, a scaling factor input, two programming inputs and one tertiary input, the output stage module comprising:

a primary divider module that includes a first primary module latch circuit with an input coupled to a first one of the programming inputs, a second primary module latch circuit with an input coupled to a second one of the programming inputs, a third primary module latch circuit with an input coupled to the scaling factor input, wherein an output of the third primary module latch circuit provides a primary divider module output, and wherein the module clock input is coupled to clock inputs of the first, second and third primary module latch circuits; and a secondary divider module that includes a multiplexer and a divide by two latch with a latch clock input coupled to the primary divider module output, the multiplexer has a multiplexer output, that provides the module clock output, a multiplexer control input coupled to the tertiary input, a first multiplexer data input coupled to an output of the divide by two latch and a second multiplexer data input coupled to the primary divider module output, wherein in operation, logic values applied to the scaling factor input and the programming inputs control transfer of data between the first, second and third primary module latch circuits resulting in the primary divider module processing a first sequence of cycles of a primary digital clock signal with a primary digital clock signal period, supplied to the module clock input, into a first base clock signal with a first base clock signal period of at least twice the primary digital clock signal period and processing a subsequent second sequence of cycles of the primary digital clock signal into a second base clock signal with a second base clock signal period of at least twice the primary digital clock signal period, and wherein the first base clock signal and the second base clock signal provide a sequence of clock pulses to the secondary divider module, and edges of the sequence of clock pulses trigger the divide by two latch thereby resulting in a latch output clock signal with a 50% duty cycle at the output of the divide by two latch, and wherein logic values at the tertiary input select one of the sequence of clock pulses and the latch output clock signal to be a module clock output signal at the module clock output.

15. The modular digital clock signal frequency divider circuit of claim 14, wherein in operation, the scaling factor input provides a scaling factor signal that blocks the sequence of clock pulses from being supplied to the secondary divider module clock input.

16. The modular digital clock signal frequency divider circuit of claim 14, wherein in operation, signals applied to the scaling factor input and logic values applied to the programming inputs determine a clock output signal period of an output signal of the multiplexer.

17. The modular digital clock signal frequency divider circuit of claim 16, wherein the clock output signal period=

$$(2^{n-1} \times MODn-1 + 2^{n-2} \times MODn-2 + \ldots 2 \times MOD1 + MOD0) \times Tin,$$

where Tin is a period of the system clock signal, n–2 is the number of modules in the circuit, and MOD0 to MODn are binary values that are selectively applied to a programming input of a respective module of the modular digital clock signal frequency divider circuit.

18. The modular digital clock signal frequency divider circuit of claim 16, wherein the output signal period=

$$(2^{n-1} \times MODn-1 + 2^{n-2} \times MODn-2 + \ldots MOD1 + 0.5 \times MOD0) \times Tin,$$

where Tin is a period of the system clock signal, n–2 is the number of modules in the circuit, and MOD0 to MODn are binary values selectively applied to a programming input of a respective module of the modular digital clock signal frequency divider circuit.

19. The modular digital clock signal frequency divider circuit of claim 14, wherein the output stage module further includes a scaling factor output that provides a pulsed signal comprising identical spaced pulses of a pulse width equal to the primary digital clock signal period.

20. The modular digital clock signal frequency divider circuit of claim 14, wherein the output stage module further includes a tertiary clock output that provides a clocking signal, and wherein during the first sequence of cycles the clocking signal has period that is at least twice that of the primary digital clock signal period.

* * * * *